United States Patent
Shimomura et al.

(10) Patent No.: US 7,405,627 B2
(45) Date of Patent: Jul. 29, 2008

(54) PLL FREQUENCY SYNTHESIZER

(75) Inventors: Katsuya Shimomura, Nagoya (JP); Kimitoshi Niratsuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/714,139

(22) Filed: Mar. 6, 2007

(65) Prior Publication Data
US 2007/0152758 A1 Jul. 5, 2007

Related U.S. Application Data

(63) Continuation of application No. PCT/JP2004/013041, filed on Sep. 8, 2004.

(51) Int. Cl.
*H03L 7/093* (2006.01)
(52) U.S. Cl. .............................. 331/2; 331/17; 331/179
(58) Field of Classification Search .................. 331/17, 331/179, 2, 46
See application file for complete search history.

(56) References Cited

U.S. PATENT DOCUMENTS 4,510,461 A * 4/1985 Dickes et al. ............... 331/1 A

OTHER PUBLICATIONS

International Search Report dated Dec. 21, 2004 in corresponding Application No. PCT/JP2004/013041.
Patent Abstracts of Japan, Publication No. 07-095069, Published Apr. 7, 1995.
Patent Abstracts of Japan, Publication No. 07-162303, Published Jun. 23, 1995.
Patent Abstracts of Japan, Publication No. 52-027342, Published Mar. 1, 1977.
Patent Abstracts of Japan, Publication No. 63-209223, Published Aug. 30, 1988.
Patent Abstracts of Japan, Publication No. 2004-282223, Published Oct. 7, 2004.

* cited by examiner

*Primary Examiner*—Robert J. Pascal
*Assistant Examiner*—James E Goodley
(74) *Attorney, Agent, or Firm*—Staas & Halsey LLP (57) ABSTRACT

In a PLL frequency synthesizer outputting signals with different frequencies: voltage-controlled oscillators output the signals and have the oscillation frequencies controlled according to control voltages; a first switch selects one of the signals; a frequency divider generates a frequency-divided signal of the selected signal by use of a changeable frequency-division ratio; a phase comparator generates the phase difference between the frequency-divided signal and a reference signal; a second switch selects one of paths connected to low-pass filters; each low-pass filter is provided for one of the voltage-controlled oscillators, has a changeable time constant, and converts the phase difference into one of the control voltages; and a controller cyclically controls the first and second switches and the frequency divider so that the voltage-controlled oscillators continuously output the signals, and changes the changeable time constant of each low-pass filter after all of the signals become stable.

9 Claims, 9 Drawing Sheets

PLL FREQUENCY SYNTHESIZER

CROSS-REFERENCE TO RELATED APPLICATIONS

This application is a continuing application, filed under 35 U.S.C. Section 111(a), of International Application PCT/JP2004/013041, filed Sep. 8, 2004.

BACKGROUND OF THE INVENTION

1. Field of the Invention

The present invention relates to a PLL (Phase Locked Loop) frequency synthesizer which outputs a plurality of signals having a plurality of frequencies.

2. Description of the Related Art

In order to concurrently output a plurality of signals having a plurality of frequencies in the conventional PLL frequency synthesizers, it is necessary to provide a plurality of PLL circuits.

Figure 8:
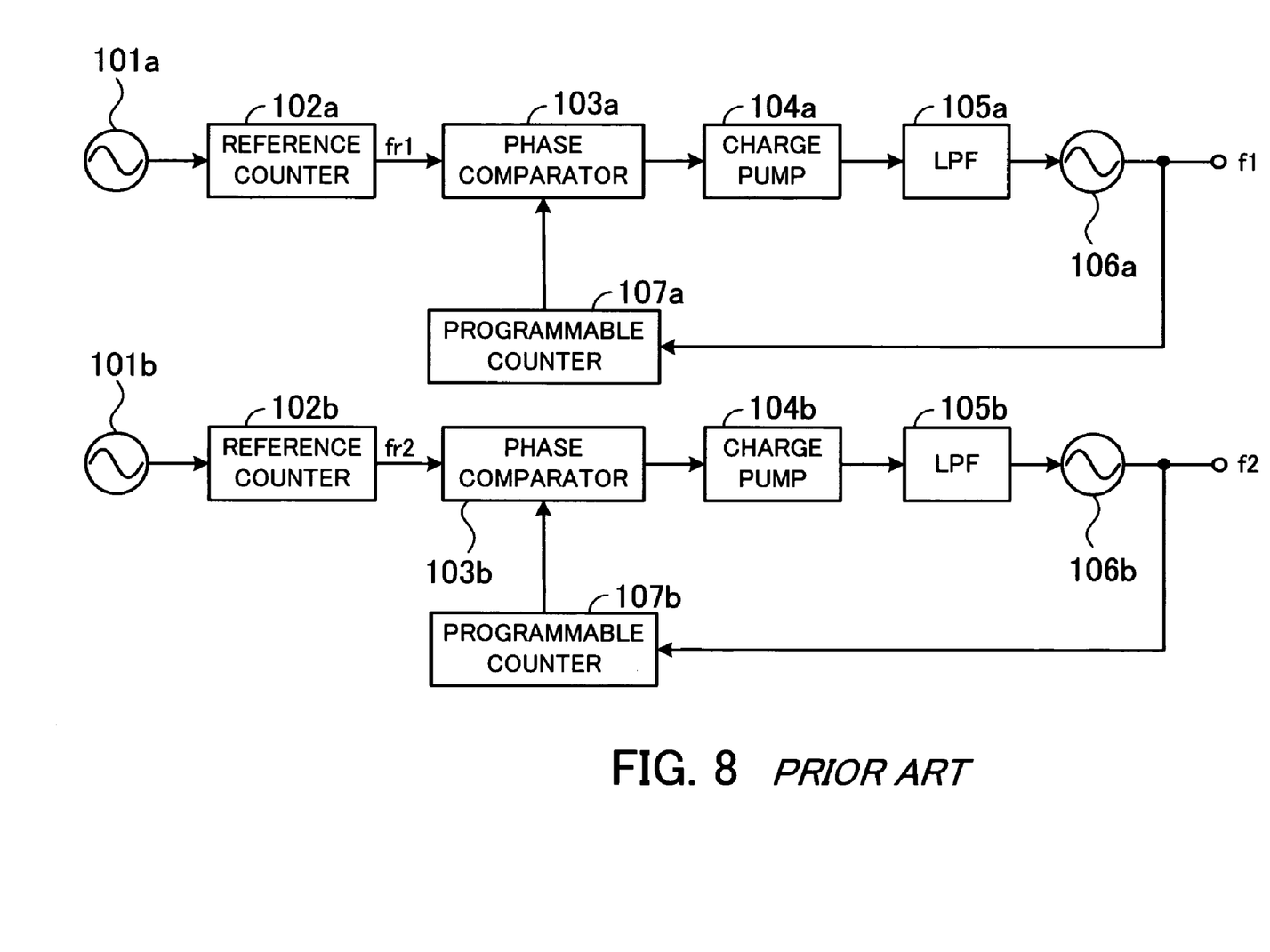
FIG. 8 is a block diagram of a conventional PLL frequency synthesizer.

FIG. 8 is a block diagram illustrating a conventional PLL frequency synthesizer. The PLL frequency synthesizer of FIG. 8 comprises reference-signal generators 101a and 101b, reference counters 102a and 102b, phase comparators 103a and 103b, charge pumps 104a and 104b, low-pass filters (LPFs) 105a and 105b, voltage-controlled oscillators 106a and 106b, and programmable counters 107a and 107b.

The reference-signal generator 101a, the reference counter 102a, the phase comparator 103a, the charge pump 104a, the LPF 105a, the voltage-controlled oscillator 106a, and the programmable counter 107a constitute a first PLL circuit, and the reference-signal generator 101b, the reference counter 102b, the phase comparator 103b, the charge pump 104b, the LPF 105b, the voltage-controlled oscillator 106b, and the programmable counter 107b constitute a second PLL circuit. Thus, two signals having two different frequencies f1 and f2 are outputted from the first and second PLL circuits, respectively.

The reference-signal generators 101a and 101b output reference signals. The reference counters 102a and 102b divide the frequencies of the reference signals outputted from the reference-signal generators 101a and 101b, and output frequency-divided reference signals having the frequencies fr1 and fr2, respectively. The phase comparator 103a detects and outputs the phase difference between a signal outputted from the programmable counter 107a and the frequency-divided reference signal outputted from the reference counter 102a, and the phase comparator 103b detects and outputs the phase difference between the signal outputted from the programmable counter 107b and the frequency-divided reference signal outputted from the reference counter 102b. Currents proportional to the phase differences outputted from the phase comparators 103a and 103b flow into or out of the charge pumps 104a and 104b. The low-pass filters (LPFs) 105a and 105b smooth the currents outputted from the charge pumps 104a and 104b, and generate DC (direct-current) voltages as control voltages, respectively. The voltage-controlled oscillators 106a and 106b output signals having the frequencies f1 and f2 according to the control voltages outputted from the low-pass filters (LPFs) 105a and 105b, respectively. The programmable counters 107a and 107b divide the frequencies f1 and f2 of the signals outputted from the voltage-controlled oscillators 106a and 106b, and output frequency-divided signals to the phase comparators 103a and 103b, respectively.

Since the reference signals outputted from the reference-signal generators 101a and 101b are different, the frequencies f1 and f2 of the signals outputted from the voltage-controlled oscillators 106a and 106b are different. Thus, signals having a plurality of frequencies are concurrently obtained by providing a plurality of PLL circuits.

However, the necessity for provision of the plurality of PLL circuits in the conventional PLL frequency synthesizer illustrated in FIG. 8 increases the number of circuit components and the circuit area. In order to overcome this problem, for example, Japanese Unexamined Patent Publication No. 63-209223 (pages 2 and 3 and FIG. 1) discloses a PLL frequency synthesizer in which some portions of PLL circuits are shared so that the number of circuit components is reduced and increase in the circuit area is suppressed.

Figure 9:
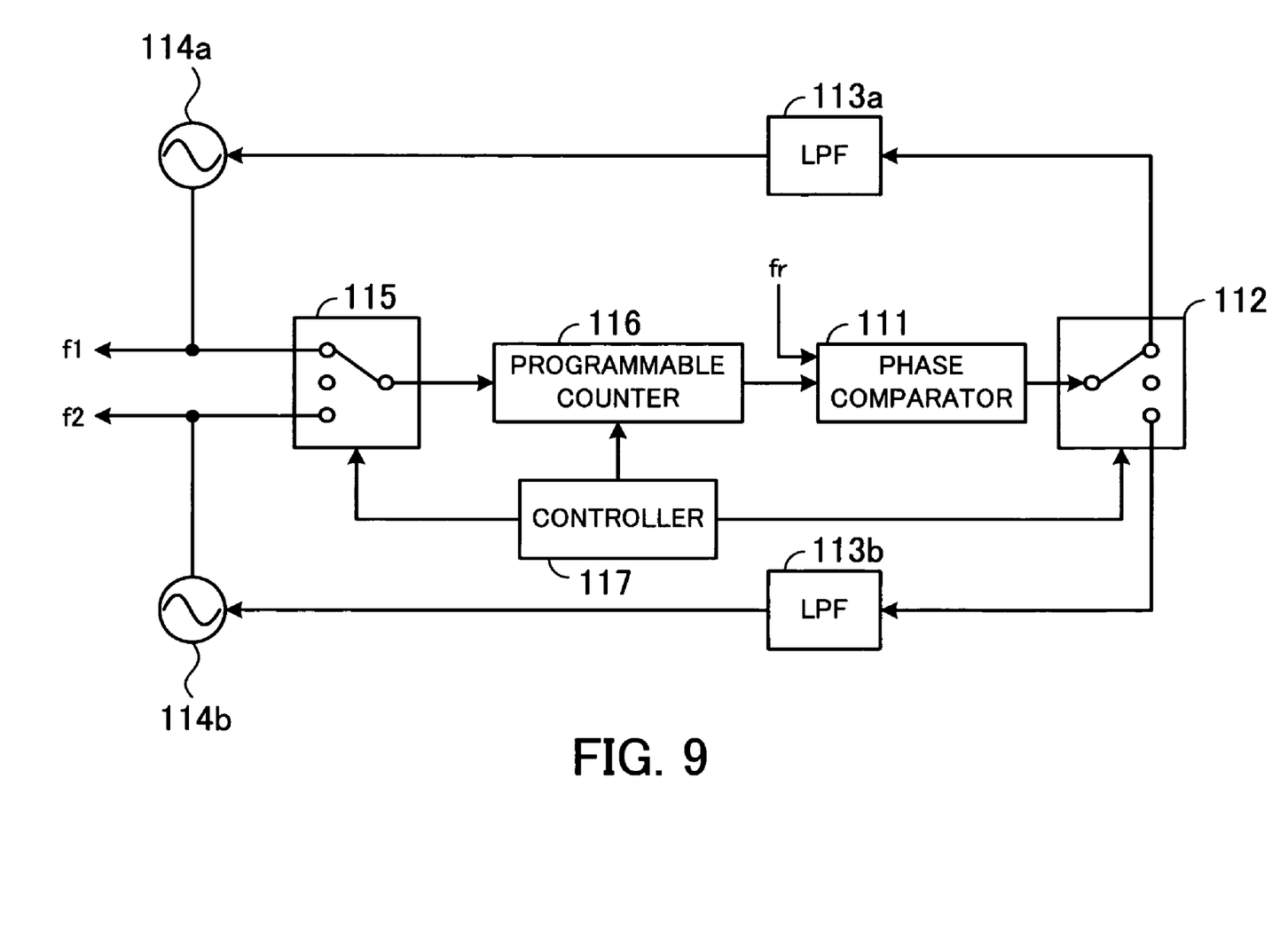
FIG. 9 is a block diagram of another conventional PLL frequency synthesizer.

FIG. 9 is a block diagram illustrating another conventional PLL frequency synthesizer. The PLL frequency synthesizer of FIG. 9 comprises a phase comparator 111, switches 112 and 115, low-pass filters (LPFs) 113a and 113b, voltage-controlled oscillators 114a and 114b, a programmable counter 116, and a controller 117.

The phase comparator 111 receives a reference signal having the frequency fr, and outputs the phase difference between the reference signal and the signal outputted from the programmable counter 116. The switch 112 is controlled by the controller 117, and outputs to the low-pass filters (LPFs) 113a and 113b the phase difference outputted from the phase comparator 111. Each of the low-pass filters (LPFs) 113a and 113b smoothes the phase difference outputted from the switch 112 to the LPF, and generates a control voltage. The voltage-controlled oscillators 114a and 114b output signals having the frequencies f1 and f2 according to control signals outputted from the low-pass filters (LPFs) 113a and 113b, respectively. The switch 115 is controlled by the controller 117, and outputs to the programmable counter 116 one of the signals outputted from the voltage-controlled oscillators 114a and 114b. The programmable counter 116 is controlled by the controller 117, and divides the frequency of the signal outputted from the switch 115.

The controller 117 controls the switches 112 and 115 and the programmable counter 116 so that the signals having the frequencies f1 and f2 are concurrently outputted from the voltage controlled oscillators 114a and 114b. In order to output the signal having the frequency f1, the controller 117 controls the switch 112 so as to connect the phase comparator 111 and the LPF 113a, and the switch 115 so as to connect the programmable counter 116 and the voltage-controlled oscillator 114a. In addition, in order to output the signal having the frequency f2, the controller 117 controls the switch 112 so as to connect the phase comparator 111 and the LPF 113b, and the switch 115 so as to connect the programmable counter 116 and the voltage-controlled oscillator 114b. Further, the controller 117 controls the frequency-division ratio of the programmable counter 116 so that the signals having the frequencies f1 and f2 are outputted. As described above, the phase comparator 111 and the programmable counter 116 are shared, and the controller 117 is provided, so that the number of circuit components is reduced and increase in the circuit area is suppressed.

Further, for example, Japanese Unexamined Patent Publication No. 7-95069 (paragraph Nos. 0018 to 0022 and FIG. 1) discloses a PLL frequency synthesizer in which the frequency is locked at a plurality of values which are set as data at a plurality of channels, and the control voltages of a voltage-controlled oscillator when the frequency is locked at the plurality of values are stored in advance. When a signal having the frequency corresponding to one of the above channels is outputted, the corresponding control voltage is outputted to the voltage-controlled oscillator, so that the lockup time can be reduced.

Nevertheless, in the PLL frequency synthesizer disclosed in Japanese Unexamined Patent Publication No. 63-209223, it is necessary to increase the time constants of the LPFs in order to stabilize the output signals after power-on, so that the lockup time increases.

In addition, since the PLL frequency synthesizer disclosed in Japanese Unexamined Patent Publication No. 7-95069 contains a storage circuit for storing the control voltages and a converter for performing analog-to-digital conversion and digital-to-analog conversion of the control voltages, the number of circuit components and the circuit area increase.

SUMMARY OF THE INVENTION

The present invention is made in view of the above problems, and the object of the present invention is to provide a PLL frequency synthesizer in which the lockup time is reduced, and increase in the circuit area is suppressed.

In order to accomplish the above object, according to the present invention, a PLL frequency synthesizer which outputs a plurality of signals having a plurality of frequencies is provided. The PLL frequency synthesizer comprises: a plurality of voltage-controlled oscillators which have oscillation frequencies and output the plurality of signals, where the oscillation frequencies are controlled according to control voltages; a first switch which selects one of the plurality of signals, and outputs the one of the plurality of signals; a frequency divider which divides a frequency of the one of the plurality of signals by a changeable frequency-division ratio, and outputs a frequency-divided signal; a phase comparator which outputs a phase difference between the frequency-divided signal and a reference signal; a second switch which selects as an output path of the phase difference one of paths respectively connected to a plurality of low-pass filters; the plurality of low-pass filters each of which is arranged in correspondence with one of the plurality of voltage-controlled oscillators, has a changeable time constant, and converts the phase difference outputted through the output path, into one of the control voltages; and a controller which cyclically controls operations of the first switch, the second switch, and the frequency divider so that the plurality of voltage-controlled oscillators continuously outputs the plurality of signals, and changes the changeable time constant of each of the plurality of low-pass filters after all of the plurality of signals become stable.

The above and other objects, features and advantages of the present invention will become apparent from the following description when taken in conjunction with the accompanying drawings which illustrate preferred embodiment of the present invention by way of example.

DESCRIPTION OF THE PREFERRED EMBODIMENTS

Preferred embodiments of the present invention will be explained below with reference to the accompanying drawings, wherein like reference numbers refer to like elements throughout.

First Embodiment

Figure 1:
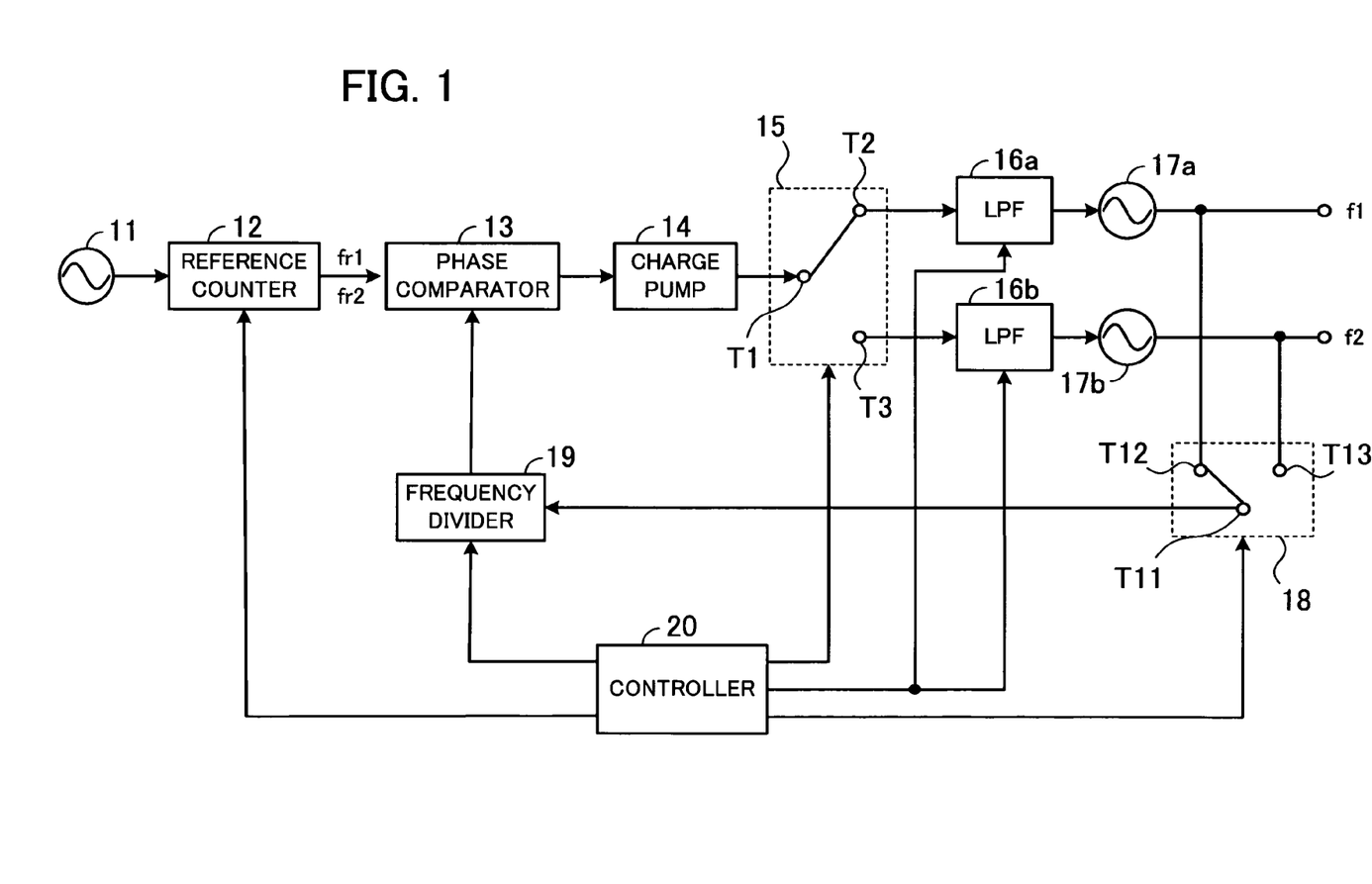
FIG. 1 is a block diagram of a PLL frequency synthesizer according to a first embodiment of the present invention.

First, a PLL frequency synthesizer according to the first embodiment of the present invention is explained below. FIG. 1 is a block diagram of the PLL frequency synthesizer according to the first embodiment.

Currently, some types of mobile telephones called the dual-band mobile telephones can operate on two different frequency bands (e.g., 800 MHz band and 1.5 GHz band). In addition, the current mobile telephones have various functions such as GPS. In order to realize such functions, the mobile telephones need clock signals having a plurality of frequencies. The PLL frequency synthesizer of FIG. 1 can output signals having a plurality of frequencies, and be used such mobile telephones.

As illustrated in FIG. 1, the PLL frequency synthesizer of FIG. 1 comprises a reference-signal generator 11, a reference counter 12, a phase comparator 13, a charge pump 14, switches 15 and 18, low-pass filters (LPFs) 16a and 16b, voltage-controlled oscillators 17a and 17b, a frequency divider 19, and a controller 20.

The reference-signal generator 11 generates a reference signal, and outputs the reference signal to the reference counter 12. For example, the reference-signal generator 11 can be realized by a quartz oscillator. The reference counter 12 divides the frequency of the reference signal outputted from the reference-signal generator 11. The reference counter 12 has two frequency-division ratios, and divides the frequency of the reference signal outputted from the reference-signal generator 11 into the frequencies fr1 and fr2 under control of the controller 20, so that reference signals having the frequencies fr1 and fr2 are outputted from the reference counter 12 to the phase comparator 13.

The phase comparator 13 detects the phase difference between a signal outputted from the frequency divider 19 and the reference signals having the frequencies fr1 and fr2 outputted from the reference counter 12, and outputs the phase difference to the charge pump 14. A current proportional to the phase difference outputted from the phase comparator 13 flows into or out of the charge pump 14. For example, when the phase is delayed, the current flows into the charge pump 14. When the phase is advanced, the current flows out of the charge pump 14. The amount of the current is increased or decreased according to the magnitude of the phase difference. When the phase difference is zero, the current is zero.

The switch 15 has terminals T1 to T3. The terminal T1 is connected to the charge pump 14, the terminal T2 is connected to the low-pass filter 16a, and the terminal T3 is connected to the low-pass filter 16b. The switch 15 switches between the connection of the terminal T1 to the terminal T2 and the connection of the terminal T1 to the terminal T3 under control of the controller 20, so that the current of the charge pump 14 can pass through the LPF 16a or 16b. The LPFs 16a and 16b are arranged in correspondence with the voltage-controlled oscillators 17a and 17b, which output signals having the frequencies f1 and f2. The terminals T2 and T3 of the switch 15 are respectively connected with the input terminals of the LPFs 16a and 16b. The low-pass filters (LPFs) 16a and 16b smooth the current of the charge pump 14, which are outputted from the terminals T2 and T3 of the switch 15, and output control voltages for controlling the oscillation frequencies in the voltage-controlled oscillators 17a and 17b.

Each of the LPFs 16a and 16b have two time constants, and the change between the two time constants is controlled by the controller 20.

Figure 2:
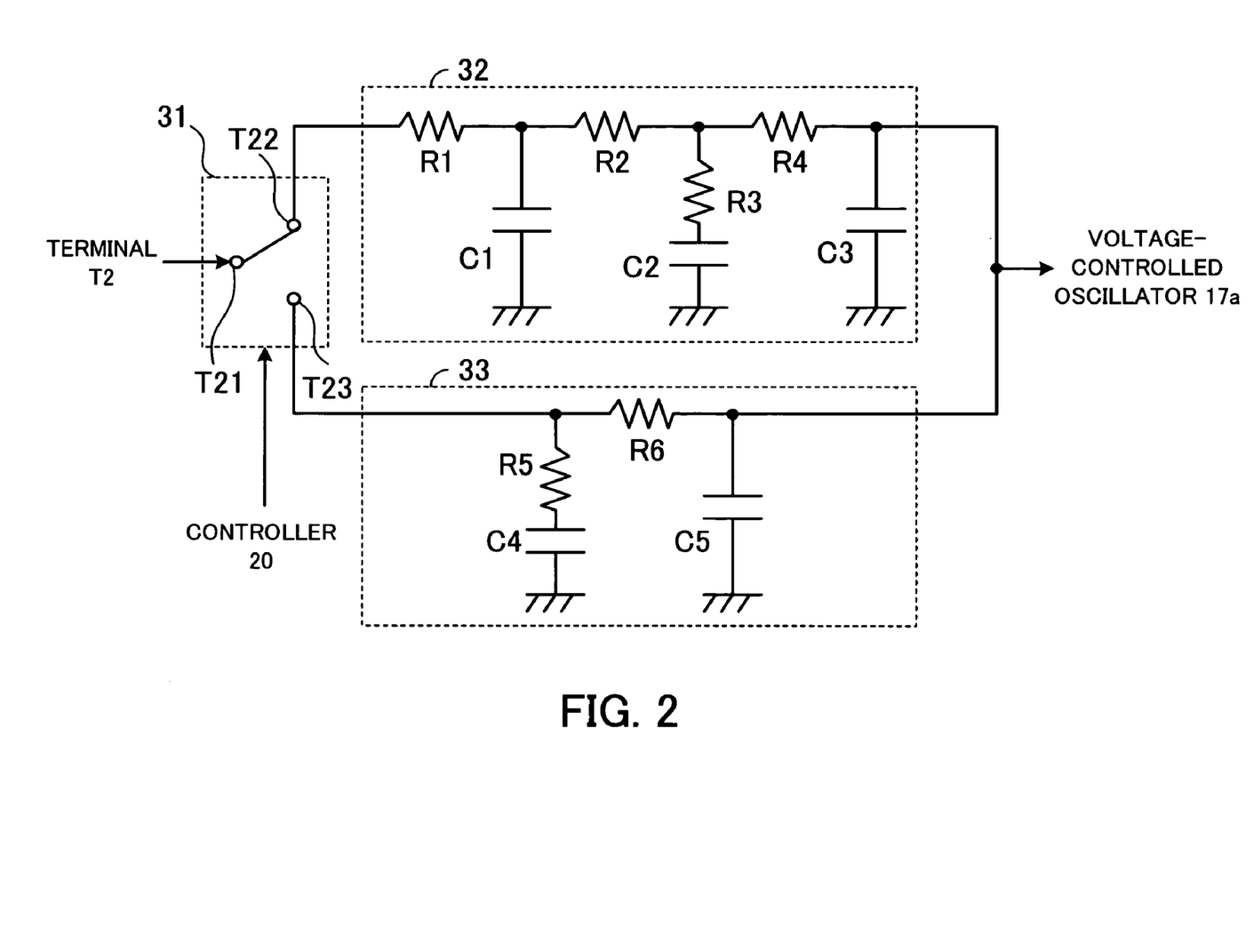
FIG. 2 is a circuit diagram of a first example of a low-pass filter used in the PLL frequency synthesizer of FIG. 1.

FIG. 2 is a circuit diagram of a first example of the LPF 16a. The LPF 16a of FIG. 2 comprises a switch 31 and low-pass filters (LPFs) 32 and 33. The current which flows out of the charge pump 14 flows into the switch 31 through the terminal T2 of the switch 15, or the current which flows into the charge pump 14 flows out of the switch 31 through the terminal T2 of the switch 15. The switch 31 switches the path of the above current between the connection with the LPF 32 and the connection with the LPF 33. The switch 31 has terminals T21 to T23. The terminal T21 is connected to the terminal T2 of the switch 15, the terminal T22 is connected to the LPF 32, and the terminal T23 is connected to the LPF 33. The switch 31 realizes the above switching of the path of the current by switching between the connection of the terminal T21 to the terminal T22 and the connection of the terminal T21 to the terminal T23 under the control of the controller 20, so that the current of the charge pump 14 can be inputted into the LPF 32 or 33.

The LPF 32 comprises resistors R1 to R4 and capacitors C1 to C3. The resistors R1, R2, and R4 are connected in series between the terminal T22 of the switch 31 and the output terminal of the LPF 16a (which is connected to the voltage-controlled oscillator 17a). One terminal of the capacitor C1 is grounded, and the other terminal of the capacitor C1 is connected to the connection point between the resistances R1 and R2. One terminal of the capacitor C2 is grounded, the other terminal of the capacitor C2 is connected to one terminal of the resistor R3, and the other terminal of the resistor R3 is connected to the connection point between the resistances R2 and R4. One terminal of the capacitor C3 is grounded, and the other terminal of the capacitor C3 is connected to the output terminal of the LPF 16a.

The LPF 33 comprises resistors R5 and R6 and capacitors C4 and C5. The resistor R6 is connected between the terminal T23 of the switch 31 and the output terminal of the LPF 16a, which is connected to the voltage-controlled oscillator 17a. One terminal of the resistor R5 is connected to the connection point between the terminal T23 and one terminal of the resistor R6 (which is connected to the terminal T23). One terminal of the capacitor C4 is grounded, and the other terminal of the capacitor C4 is connected to the other terminal of the resistor R5. One terminal of the capacitor C5 is grounded, and the other terminal of the capacitor C5 is connected to the output terminal of the LPF 16a.

The LPF 32 has a greater time constant than the LPF 33 since the LPF 32 contains the low-pass filter constituted by the resistor R1 and the capacitor C1 although the other portions of the LPF 32 corresponding to the LPF 33. Therefore, the path of the current of the charge pump 14 can be switched between the LPFs 32 and 33 (having different time constants) by switching between the connection of the terminal T21 to the terminal T22 and the connection of the terminal T21 to the terminal T23.

In the case where the LPF 16a has the construction illustrated in FIG. 2, the LPF 16b has a construction similar to the LPF 16a, although the two time constants of the LPF 16b are different from the two time constants of the LPF 16a.

Figure 3:
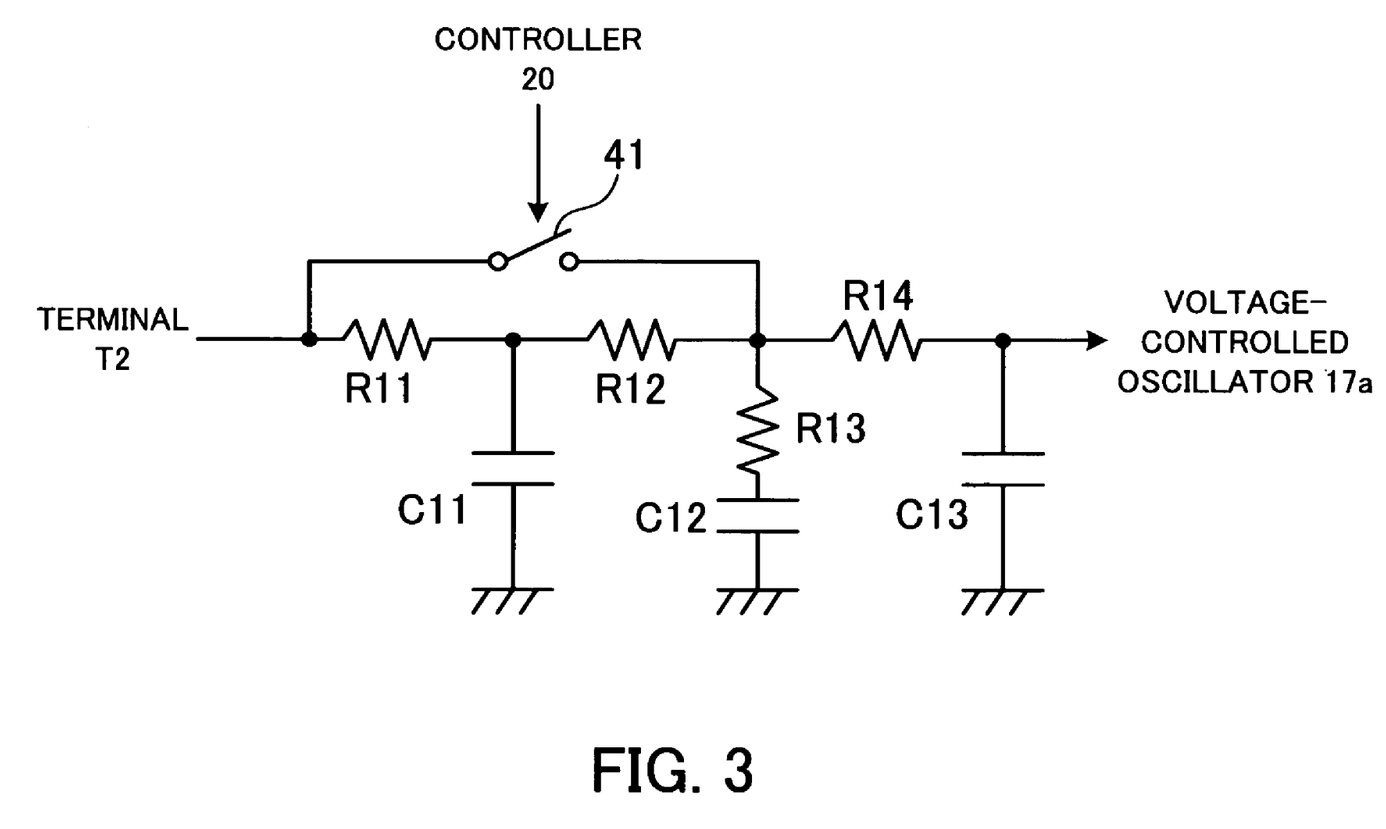
FIG. 3 is a circuit diagram of a second example of the low-pass filter used in the PLL frequency synthesizer of FIG. 1.

FIG. 3 is a circuit diagram of a second example of the LPF 16a. The LPF 16a of FIG. 3 comprises a switch 41, resistors R11 to R14, and capacitors C11 to C13. The resistors R11, R12, and R14 are connected in series between the input terminal of the LPF 16a (which is connected to the terminal T2 of the switch 15) and the output terminal of the LPF 16a (which is connected to the voltage-controlled oscillator 17a). One terminal of the capacitor C11 is grounded, and the other terminal of the capacitor C11 is connected to the connection point between the output-side terminal of the resistor R11 and the input-side terminal of the resistor R12. One terminal of the capacitor C12 is grounded, the other terminal of the capacitor C12 is connected to one terminal of the resistor R13, and the other terminal of the resistor R13 is connected to the connection point between the output-side terminal of the resistance R12 and the input-side terminal of the resistor R14. One terminal of the capacitor C13 is grounded, and the other terminal of the capacitor C13 is connected to the connection point between the output-side terminal of the resistor R14 and the voltage-controlled oscillator 17a (i.e., the output terminal of the LPF 16a, which is connected to the voltage-controlled oscillator 17a).

One terminal of the switch 41 is connected to the input terminal of the LPF 16a (i.e., the connection point between the terminal T2 of the switch 15 and the input-side terminal of the resistor R11), and the other terminal of the switch 41 is connected to the connection point between the output-side terminal of the resistor R12 and the input-side terminal of the resistor R14. The switch 41 is on/off controlled by the controller 20. When the switch 41 is turned on, the input-side terminal of the resistor R11 and the output-side terminal of the resistor R12 are short-circuited, so that the circuit of FIG. 3 becomes a low-pass filter which is constituted by only the resistors R13 and R14 and the capacitors C12 and C13, and in which the resistors R11 and R12 and the capacitor C11 do not contribute to the operation of the circuit of FIG. 3. At this time, the circuit of FIG. 3 has a small time constant compared with the circuit of FIG. 3 in which the resistors R11 and R12 and the capacitor C11 contribute to the operation.

In the case where the LPF 16a has the construction illustrated in FIG. 3, the LPF 16b has a construction similar to the LPF 16a, although the two time constants of the LPF 16b are different from the two time constants of the LPF 16a.

Referring back to FIG. 1, the voltage-controlled oscillators 17a and 17b output signals having the frequencies f1 and f2, respectively. The frequencies f1 and f2 of the voltage-controlled oscillators 17a and 17b are controlled by the control voltages outputted from the LPFs 16a and 16b, respectively.

The switch 18 has the terminals T11 to T13. The terminal T12 is connected to the output terminal of the voltage-controlled oscillator 17a, and the terminal T13 is connected to the output terminal of the voltage-controlled oscillator 17b. The terminal T11 is connected to the frequency divider 19. The switch 18 switches between the connection of the terminal T12 to the terminal T11 and the connection of the terminal T13 to the terminal T11 under control of the controller 20, and outputs to the frequency divider 19 a selected one of the signals outputted from the voltage-controlled oscillators 17a and 17b.

The frequency divider 19 divides the frequency of the signal selected by the switch 18, and outputs a frequency-divided signal to the phase comparator 13. The frequency divider 19 is realized by a programmable counter, and the frequency-division ratio of the frequency divider 19 can be changed between N1 and N2. The frequency divider 19 may be either an integer frequency divider or a non-integer (fractional) frequency divider. In the case where the frequency divider 19 is an integer frequency divider, the PLL frequency synthesizer of FIG. 1 becomes an integer PLL frequency synthesizer. In the case where the frequency divider 19 is a non-integer (fractional) frequency divider, the PLL frequency synthesizer of FIG. 1 becomes a fractional PLL frequency synthesizer.

The controller 20 alternately changes the frequency-division ratios of the reference counter 12 and the frequency divider 19 and the connections in the switches 15 and 18. When the signals outputted from the voltage-controlled oscillators 17a and 17b become stable, the controller 20 controls each of the LPFs 16a and 16b so that the time constant of the LPF is switched from the greater value to the smaller value.

In order to output a signal having the frequency f1 from the PLL frequency synthesizer, the controller 20 controls the reference counter 12 so that the frequency of the reference signal outputted from the reference counter 12 becomes fr1. In addition, the controller 20 controls the switch 15 so that the current outputted from the charge pump 14 is inputted into the LPF 16a. Further, the controller 20 controls the switch 18 so that the signal outputted from the voltage-controlled oscillator 17a is fed back through the frequency divider 19 to the phase comparator 13. Furthermore, the controller 20 controls the frequency divider 19 so that the frequency-division ratio of the frequency divider 19 becomes N1. Thus, a PLL circuit is formed by the reference counter 12 (which outputs the reference signal having the frequency fr1), the phase comparator 13, the charge pump 14, the LPF 16a, the voltage-controlled oscillator 17a, and the frequency divider 19 (which has the frequency-division ratio N1) in the circuit of FIG. 1, so that the voltage-controlled oscillator 17a which outputs a signal having the frequency f1.

In order to output a signal having the frequency f2 from the PLL frequency synthesizer, the controller 20 controls the reference counter 12 so that the frequency of the reference signal outputted from the reference counter 12 becomes fr2. In addition, the controller 20 controls the switch 15 so that the current outputted from the charge pump 14 is inputted into the LPF 16b. Further, the controller 20 controls the switch 18 so that the signal outputted from the voltage-controlled oscillator 17b is fed back through the frequency divider 19 to the phase comparator 13. Furthermore, the controller 20 controls the frequency divider 19 so that the frequency-division ratio of the frequency divider 19 becomes N2. Thus, a PLL circuit is formed by the reference counter 12 (which outputs the reference signal having the frequency fr2), the phase comparator 13, the charge pump 14, the LPF 16b, the voltage-controlled oscillator 17b, and the frequency divider 19 (which has the frequency-division ratio N2) in the circuit of FIG. 1, so that the voltage-controlled oscillator 17b outputs a signal having the frequency f2.

The controller 20 alternately changes the frequency-division ratio of the reference counter 12, the connection in the switch 15 (between the connection of the terminal T1 to the terminal T2 and the connection of the terminal T1 to the terminal T3), and the connection in the switch 18 (between the connection of the terminal T12 to the terminal T11 and the connection of the terminal T13 to the terminal T11), and the frequency-division ratio of the frequency divider 19 (between N1 and N2) so that the voltage-controlled oscillators 17a and 17b continuously output the signals having the frequencies f1 and f2. During the above alternate changes, the two PLL circuits are alternately realized in the circuit of FIG. 1. In other words, the two PLL circuits are alternately in a floating state. However, the control voltage outputted from each of the LPFs 16a and 16b to the corresponding one of the voltage-controlled oscillators 17a and 17b is maintained for a certain time according to the time constant of the LPF (although the leakage current causes some variation). Therefore, the voltage-controlled oscillators 17a and 17b can continuously output the signals having the frequencies f1 and f2.

In addition, after power-on, the controller 20 alternately changes the operations of the reference counter 12, the switches 15 and 18, and the frequency divider 19 so that each of the signals having the frequencies f1 and f2 is outputted a predetermined number of times, and thereafter changes the time constant of each of the LPFs 16a and 16b from the greater value to the smaller value.

Figure 4:
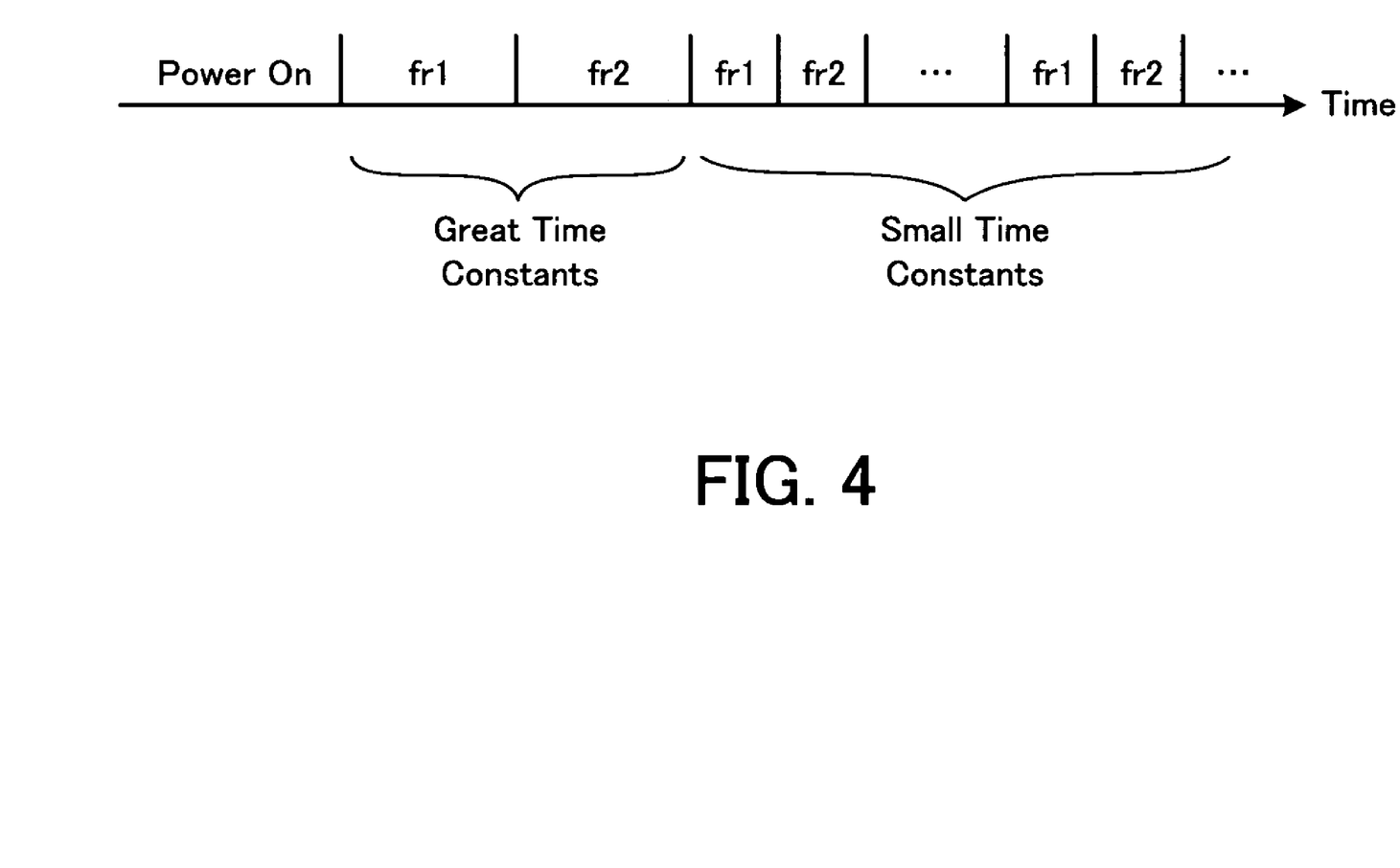
FIG. 4 is a timing diagram indicating examples of the timings of the outputs of a reference counter and the time constants of LPFs.

FIG. 4 is a timing diagram indicating examples of the timings of the outputs of the reference counter 12 and the time constants of the LPFs. After power-on, the controller 20 controls the operations of the reference counter 12, the switches 15 and 18, and the frequency divider 19 so that each of the signals having the frequencies fr1 and fr2 is outputted once from the reference counter 12 (as indicated in FIG. 4), and each of the voltage-controlled oscillators 17a and 17b is controlled once so as to output the signal having the corresponding one of the frequencies f1 and f2. Thereafter, the controller 20 changes the time constant of each of the LPFs 16a and 16b from the greater value to the smaller value (as indicated in FIG. 4). Specifically, first, the controller 20 controls the reference counter 12 so as to output the reference signal having the frequency fr1. At this time, the controller 20 controls the switches 15 and 18 so that the voltage-controlled oscillator 17a outputs the signal having the frequency f1, and controls the frequency divider 19 so as to divide the frequency of the voltage-controlled oscillator 17a by the frequency-division ratio N1. Next, the controller 20 controls the reference counter 12 so as to output the reference signal having the frequency fr2. At this time, the controller 20 controls the switches 15 and 18 so that the voltage-controlled oscillator 17b outputs the signal having the frequency f2, and controls the frequency divider 19 so as to divide the frequency of the voltage-controlled oscillator 17b by the frequency-division ratio N2.

After power-on, the control voltages of the voltage-controlled oscillators 17a and 17b greatly vary (from 0 V to a predetermined voltage). In order to stabilize the control voltages, it is necessary that the time constants of the LPFs 16a and 16b be great. On the other hand, when the signals outputted from the voltage-controlled oscillators 17a and 17b are stabilized, the control voltages are also stabilized, so that the time constants can be switched to the smaller values. This is because when the signals outputted from the voltage-controlled oscillators 17a and 17b are stabilized, the control voltages vary only for compensating for the leakage current and correcting deviations from the frequencies f1 and f2 of the signals outputted from the voltage-controlled oscillators 17a and 17b, so that the variations in the control voltages are small. Thus, according to the present invention, after power-on, when the signals being outputted from the voltage-controlled oscillators 17a and 17b and having the frequencies f1 and f2 are stabilized, the time constants are switched to the smaller values in order to reduce the lockup time.

Although the controller 20 controls the operations of the reference counter 12, the switches 15 and 18, and the frequency divider 19 so that each of the voltage-controlled oscillators 17a and 17b is controlled once so as to output the signal having the corresponding one of the frequencies f1 and f2 after power-on and before the change of the time constants of the LPFs 16a and 16b in the example of FIG. 4, it is possible to control each of the voltage-controlled oscillators 17a and 17b two or more times so as to output the signal having the corresponding one of the frequencies f1 and f2 after power-on and before the change of the time constants when it takes much time to stabilize the signals outputted from the voltage-controlled oscillators 17a and 17b. In this case, for example, each of the voltage-controlled oscillators 17a and 17b receives the control voltage twice before the change of the time constants. At this time, the reference counter 12 is controlled so as to change the frequency of the reference signal as fr1, fr2, fr1, and fr2.

Figure 5:
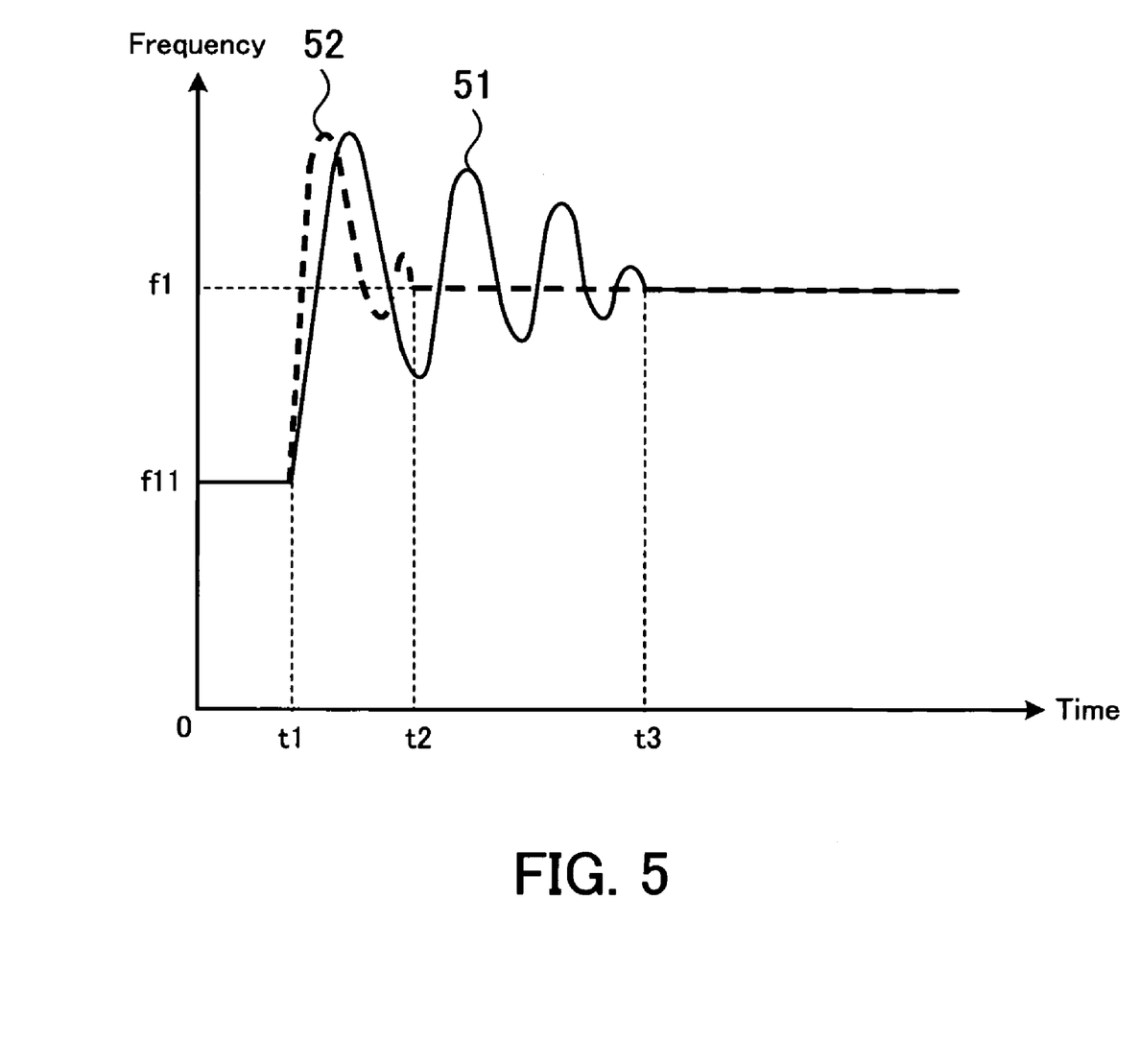
FIG. 5 is a diagram provided for explaining the lockup time.

Next, the lockup time is explained below with reference to FIG. 5, which is a diagram provided for explaining the lockup time. When the time constants of the LPFs 16a and 16b are greater, the operation of the PLL frequency synthesizer is more resistant to variations in the signals, although the lockup time is greater. In FIG. 5, the curve 51 indicates variations of the frequency of the signal outputted from the voltage-controlled oscillator 17a when the time constants of the LPFs 16a and 16b are the greater values, and the curve 52 indicates variations of the frequency of the signal outputted from the voltage-controlled oscillator 17a when the time constants of the LPFs 16a and 16b are the smaller values.

In the example of FIG. 5, it is assumed that the frequency of the signal outputted from the voltage-controlled oscillator 17a is initially f11, which is deviated from the desired value f1. When the time constants of the LPFs 16a and 16b are the greater values, the lockup time (i.e., the time necessary for the frequency of the signal outputted from the voltage-controlled oscillator 17a to recover from f11 to f1) is greater as indicated by the time t3−t1. On the other hand, when the time constants of the LPFs 16a and 16b are the smaller values, the lockup time is smaller as indicated by the time t2−t1.

Therefore, according to the first embodiment of the present invention, the time constants of the LPFs 16a and 16b are initially the greater values after power-on, and thereafter the time constants of the LPFs 16a and 16b are changed to the smaller values when the signals outputted from the voltage-controlled oscillators 17a and 17b are stabilized. Thus, the lockup time is reduced.

Hereinbelow, the operations of the PLL frequency synthesizer illustrated in FIG. 1 are explained in detail.

After power-on, the controller 20 selects the greater time constants of the LPFs 16a and 16b since the variations in the control voltages of the outputs of the LPFs 16a and 16b are great at this time. In addition, the controller 20 controls the reference counter 12 so as to output the reference signal having the frequency fr1, Further, the controller 20 controls the switches 15 and 18 so that the terminals T1 and T2 in the switch 15 are connected and the terminals T11 and T12 in the switch 18 are connected. Furthermore, the controller 20 controls the frequency divider 19 so as to use the frequency-division ratio N1. Thus, a PLL circuit is formed by the reference counter 12 (which outputs the reference signal having the frequency fr1), the phase comparator 13, the charge pump 14, the LPF 16a, the voltage-controlled oscillator 17a, and the frequency divider 19 (which uses the frequency-division ratio N1) in the circuit of FIG. 1, so that the voltage-controlled oscillator 17a outputs a signal having the frequency f1 (=N1×fr1).

When the output of the voltage-controlled oscillator 17a is stabilized, the controller 20 controls the reference counter 12 so as to output the reference signal having the frequency fr2. Further, the controller 20 controls the switches 15 and 18 so that the terminals T1 and T3 in the switch 15 are connected and the terminals T11 and T13 in the switch 18 are connected. Furthermore, the controller 20 controls the frequency divider 19 so as to use the frequency-division ratio N2. Thus, a PLL circuit is formed by the reference counter 12 (which outputs the reference signal having the frequency fr2), the phase comparator 13, the charge pump 14, the LPF 16b, the voltage-controlled oscillator 17b, and the frequency divider 19 (which uses the frequency-division ratio N2) in the circuit of FIG. 1, and the voltage-controlled oscillator 17b outputs a signal having the frequency f2 (=N2×fr2).

When both of the outputs of the voltage-controlled oscillators 17a and 17b are stabilized, the control voltage are also stabilized. Therefore, the controller 20 changes the time constants of the LPFs 16a and 16b to the smaller values. Then, the controller 20 controls the reference counter 12 so as to output the reference signal having the frequency fr1. Further, the controller 20 controls the switches 15 and 18 so that the terminals T1 and T2 in the switch 15 are connected and the terminals T11 and T12 in the switch 18 are connected. Furthermore, the controller 20 controls the frequency divider 19 so as to use the frequency-division ratio N1. At this time, the PLL circuit constituted by the LPF 16b and the voltage-controlled oscillator 17b is in a floating state. Nevertheless, the control voltage outputted from the LPF 16b is substantially maintained by the time constant of the LPF 16b (although the leakage current slightly lowers the control voltage), so that the voltage-controlled oscillator 17b keeps outputting the signal having the frequency f2 even in the floating state.

Thereafter, the controller 20 controls the reference counter 12 so as to output the reference signal having the frequency fr2. Further, the controller 20 controls the switches 15 and 18 so that the terminals T1 and T3 in the switch 15 are connected and the terminals T11 and T13 in the switch 18 are connected. Furthermore, the controller 20 controls the frequency divider 19 so as to use the frequency-division ratio N2. At this time, the PLL circuit constituted by the LPF 16a and the voltage-controlled oscillator 17a is in a floating state. Nevertheless, the control voltage outputted from the LPF 16a is substantially maintained by the time constant of the LPF 16a (although the leakage current slightly lowers the control voltage), so that the voltage-controlled oscillator 17a keeps outputting the signal having the frequency f1 even in the floating state.

After the above operations, the controller 20 alternately changes the frequency-division ratios of the reference counter 12 and the frequency divider 19 and the connections in the switches 15 and 18 while maintaining the smaller time constants in the LPFs 16a and 16b. The smaller values of the time constants in the LPFs 16a and 16b are determined so that the control voltages outputted from the LPFs 16a and 16b are substantially maintained even when the corresponding PLL circuits alternately come into a floating state as described before.

Figure 6:
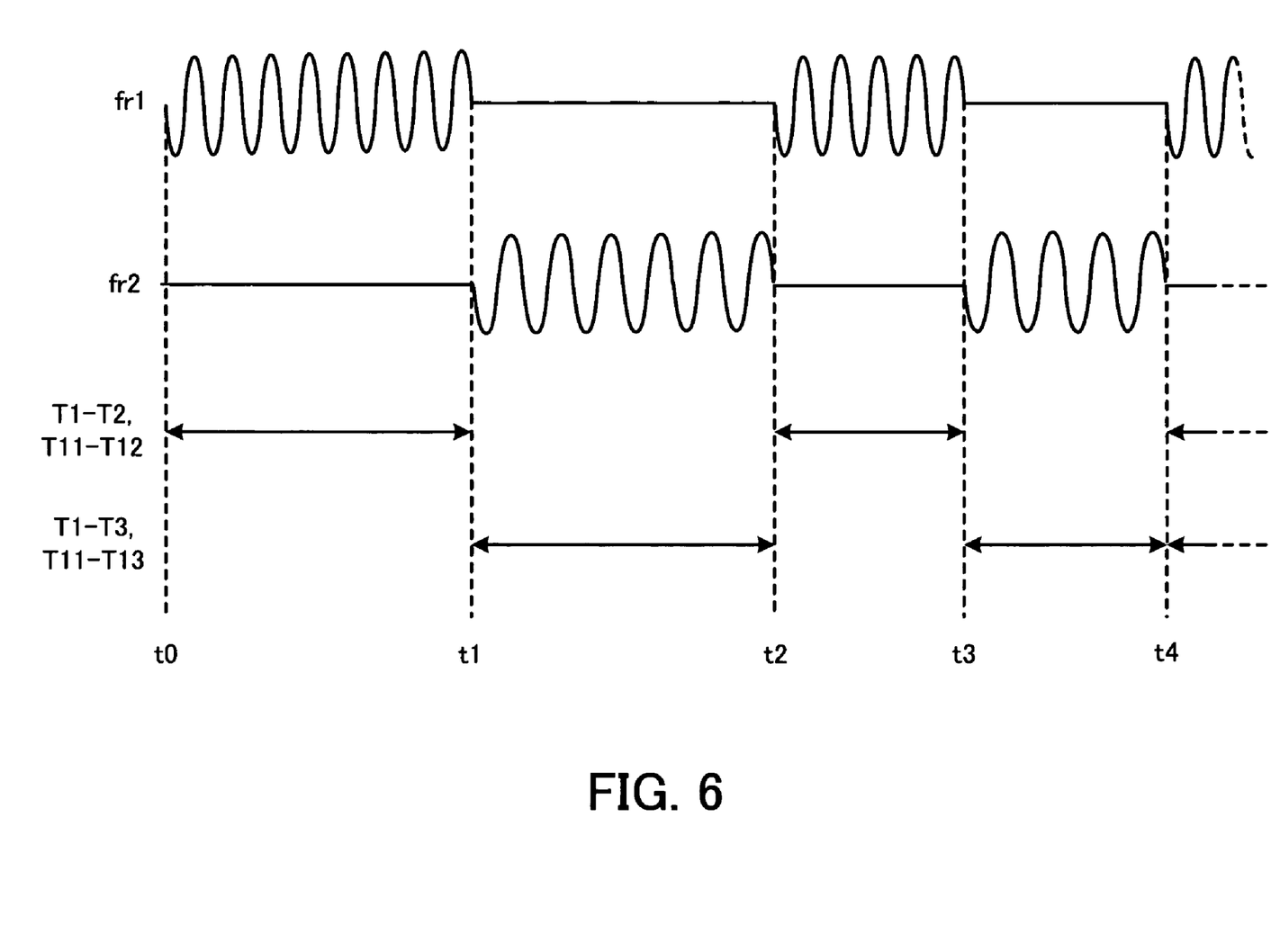
FIG. 6 is a diagram indicating the waveforms of reference signals outputted from a reference counter and the connection status of switches.

FIG. 6 is a diagram indicating the waveforms of the reference signals having the frequencies fr1 and fr2 and being outputted from the reference counter 12 and the status of the connection of the terminal T1 to the terminal T2 and the connection of the terminal T1 to the terminal T3 in the switch 15 and the connection of the terminal T11 to the terminal T12 and the connection of the terminal T11 to the terminal T13 in the switch 18. In FIG. 6, the arrowed solid lines indicate the durations in which the corresponding connections are established.

At time t0, the PLL frequency synthesizer is powered up. At this time, the controller 20 controls the reference counter 12 so as to output the reference signal having the frequency fr1, the switch 15 so as to connect the terminals T1 and T2, and the switch 18 so as to connect the terminals T11 and T12.

At time t1, the controller 20 controls the reference counter 12 so as to output the reference signal having the frequency fr2, the switch 15 so as to connect the terminals T1 and T3, and the switch 18 so as to connect the terminals T11 and T13.

The controller 20 selects the greater time constants of the LPFs 16a and 16b from time t0 to t2. At time t2, the signals having the frequencies f1 and f2 are stabilized. Therefore, the controller 20 changes the time constants of the LPFs 16a and 16b to the smaller values. Then, the controller 20 controls the reference counter 12 so as to output the reference signal having the frequency fr1, the switch 15 so as to connect the terminals T1 and T2, and the switch 18 so as to connect the terminals T11 and T12.

At time t3, the controller 20 controls the reference counter 12 so as to output the reference signal having the frequency fr2, the switch 15 so as to connect the terminals T1 and T3, and the switch 18 so as to connect the terminals T11 and T13.

Thereafter, the operations at the times t2 and t3 are alternately repeated while maintaining the time constants of the LPFs 16a and 16b at the smaller values.

As described above, the time constants of the LPFs 16a and 16b are changed to the smaller values after the signals outputted from the voltage-controlled oscillators 17a and 17b are stabilized. Therefore, the lockup time can be reduced. When the lockup time is reduced, it is possible to quickly respond to a change in the frequencies f1 and f2.

In addition, the storage circuit for storing the control voltages or the converter for performing analog-to-digital conversion and digital-to-analog conversion of the control voltages is unnecessary. Therefore, the increase in the circuit area can be suppressed. Further, since the PLL frequency synthesizer of FIG. 1 shares the reference counter 12, the phase comparator 13, the charge pump 14, and the frequency divider 19, the circuit area can be reduced.

Although the PLL frequency synthesizer of FIG. 1 is constructed so as to output two signals having the two frequencies f1 and f2, it is possible to construct a PLL frequency synthesizer which outputs signals having the three or more frequencies. In this case, the respective constituents of the PLL frequency synthesizer of FIG. 1 may be modified as follows.

That is, the reference counter 12 is modified to output three or more signals having three or more frequencies, and the switch 15 is modified to have three or more operational paths for outputting the current of the charge pump 14. In addition, three or more voltage-controlled oscillators and three or more low-pass filters (LPFs) corresponding to the voltage-controlled oscillators are provided in the PLL frequency synthesizer. Further, the switch 18 is modified to select one of three or more signals outputted from the three or more voltage-controlled oscillators, and output the selected signal to the frequency divider 19. Furthermore, the frequency divider 19 is modified to be able to divide the frequency of the signal supplied from the switch 18 by any of three or more frequency-division ratios. The controller 20 controls the respective constituents of the PLL frequency synthesizer so that the three or more PLL circuits outputting the three or more frequencies are controlled in turn.

Second Embodiment

Figure 7:
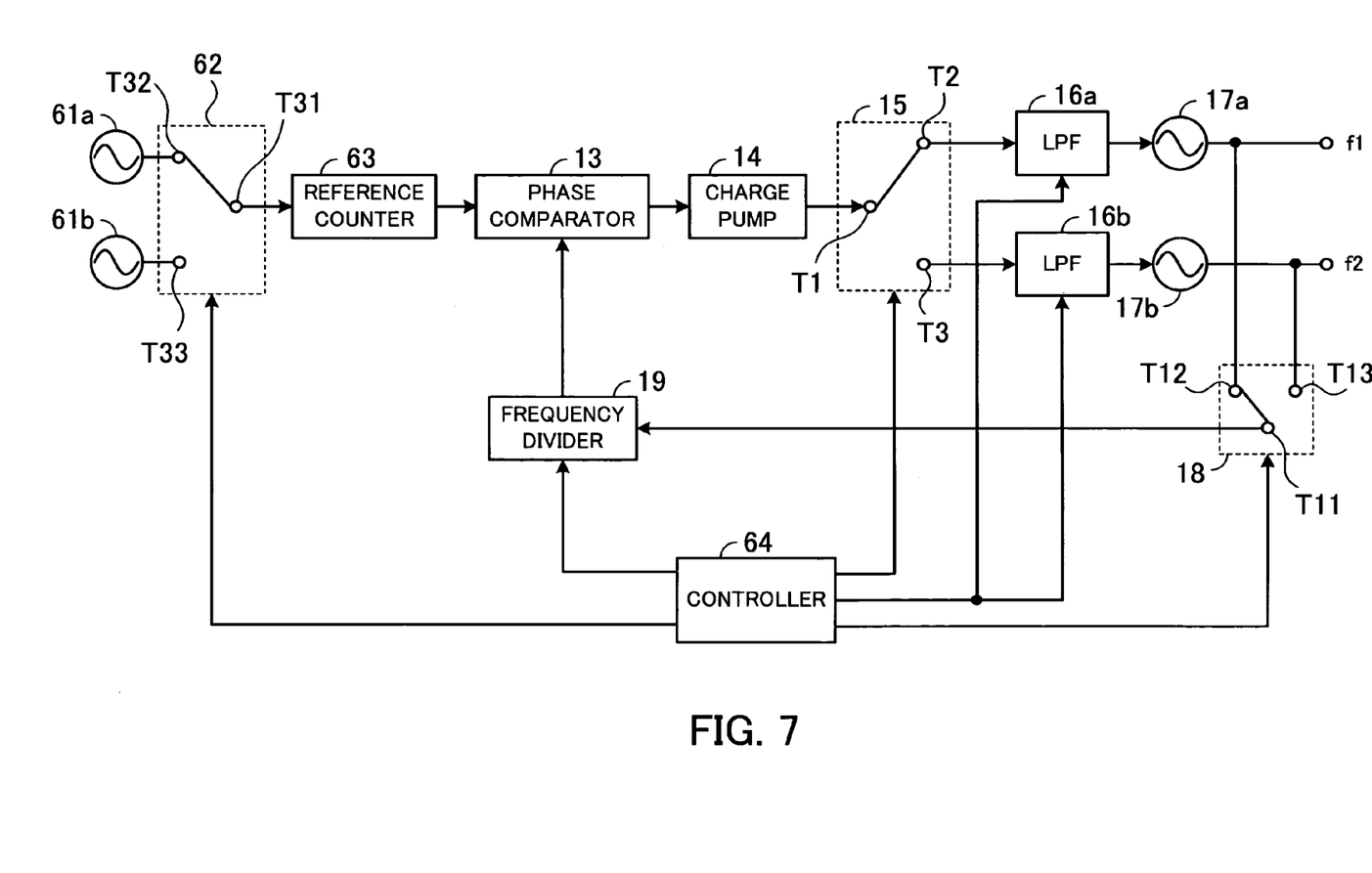
FIG. 7 is a block diagram of a PLL frequency synthesizer according to a second embodiment of the present invention.

Next, a PLL frequency synthesizer according to the second embodiment of the present invention is explained below. FIG. 7 is a block diagram of the PLL frequency synthesizer according to the second embodiment.

In the PLL frequency synthesizer according to the second embodiment, a plurality of reference-signal generators 61a and 61b and a switch 62 are provided. The reference-signal generators 61a and 61b generate different reference signals, and the switch 62 selects one of the reference signals outputted from the reference-signal generators 61a and 61b, and supplies the selected reference signal to the reference counter 63. The other constituents of the PLL frequency synthesizer of FIG. 7 are similar to the corresponding constituents of the PLL frequency synthesizer of FIG. 1. In the following explanations, only the differences from the first embodiment are described, and the explanations on the similar constituents are not repeated.

The reference-signal generators 61a and 61b generate reference signals having different frequencies, and can be realized by, for example, quartz oscillators.

The switch 62 selects one of the reference signals outputted from the reference-signal generators 61a and 61b under control of the controller 64, and outputs the selected reference signal to the reference counter 63. The switch 62 has terminals T31 to T33. The terminal T32 is connected to the reference-signal generator 61a, the terminal T33 is connected to the reference-signal generator 61b, and the terminal T31 is connected to the reference counter 63. The switch 62 switches between the connection of the terminal T32 to the terminal T31 and the connection of the terminal T33 to the terminal T31 under control of the controller 64.

The reference counter 63 divides the frequency of the reference signal outputted from the reference-signal generator 61a or 61b through the switch 62, and outputs the frequency-divided reference signal to the phase comparator 13.

The controller 64 performs the operation of controlling the switch 62, in addition to operations similar to the controller 20 in the first embodiment. When the controller 64 controls the switches 15 and 18 and the frequency divider 19 so that the PLL frequency synthesizer of FIG. 7 outputs the signal having the frequency f1, the controller 64 also controls the switch 62 so that the terminals T31 and T32 are connected. When the controller 64 controls the switches 15 and 18 and the frequency divider 19 so that the PLL frequency synthesizer of FIG. 7 outputs the signal having the frequency f2, the controller 64 also controls the switch 62 so that the terminals T31 and T33 are connected.

Even in the case where the two reference signals are generated by providing the reference-signal generators 61a and 61b, it is also possible to reduce the lockup time and suppress increase in the circuit area.

ADDITIONAL MATTERS

In the PLL frequency synthesizer according to the present invention, the time constants of the low-pass filters are changed after all the signals having the desired frequencies and being outputted from the PLL frequency synthesizer are stabilized. Therefore, the lockup time can be reduced. In addition, the storage circuit for storing the control voltages or the converter for performing analog-to-digital conversion and digital-to-analog conversion of the control voltages is unnecessary. Therefore, it is possible to suppress the increase in the circuit area.

The foregoing is considered as illustrative only of the principle of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A PLL frequency synthesizer which outputs a plurality of signals having a plurality of frequencies, comprising:
    a plurality of voltage-controlled oscillators which have oscillation frequencies and output said plurality of signals, where the oscillation frequencies are controlled according to control voltages;
    a first switch which selects one of said plurality of signals, and outputs the one of the plurality of signals;
    a frequency divider which divides a frequency of said one of the plurality of signals by a changeable frequency-division ratio, and outputs a frequency-divided signal;
    a phase comparator which outputs a phase difference between said frequency-divided signal and a reference signal;
    a second switch which selects as an output path of said phase difference one of paths respectively connected to the plurality of voltage-controlled oscillators;
    a plurality of low-pass filters each of which is arranged in correspondence with one of said plurality of voltage-controlled oscillators, has a changeable time constant, and converts said phase difference outputted through said output path, into one of said control voltages; and
    a controller which cyclically controls operations of said first switch, said second switch, and said frequency divider so that said plurality of voltage-controlled oscillators continuously outputs said plurality of signals, and changes said changeable time constant of each of said plurality of low-pass filters after all of said plurality of signals become stable.

2. The PLL frequency synthesizer according to claim 1, wherein said changeable time constant corresponds to one of at least two values, and said controller changes said changeable time constant of each of said plurality of low-pass filters from a greater value to a smaller value after all of said plurality of signals become stable.

3. The PLL frequency synthesizer according to claim 1, wherein said controller changes said changeable time constant after the controller controls once said first switch, said second switch, and said frequency divider so that each of said plurality of voltage-controlled oscillators outputs a corresponding one of said plurality of signals with a corresponding one of said plurality of frequencies.

4. The PLL frequency synthesizer according to claim 1, wherein each of said plurality of low-pass filters contains two low-pass filter circuits having different time constants, and said controller changes said changeable time constant by changing selection of one of the two low-pass filter circuits.

5. The PLL frequency synthesizer according to claim 1, wherein said changeable time constant of each of said plurality of low-pass filters is changed by short-circuiting a portion of a circuit realizing said each of said plurality of low-pass filters.

6. The PLL frequency synthesizer according to claim 1, further comprising,
    a signal generator which generates a signal having a frequency, and
    a reference frequency divider which generates said reference signal by dividing the frequency of said signal generated by said signal generator, by a frequency-division ratio which can be changed under control of said controller.

7. The PLL frequency synthesizer according to claim 1, further comprising a plurality of reference-signal generators each of which generates said reference signal.

8. The PLL frequency synthesizer according to claim 1, wherein said frequency divider realizes integer frequency division of said one of the plurality of signals.

9. The PLL frequency synthesizer according to claim 1, wherein said frequency divider realizes non-integer frequency division of said one of the plurality of signals.

* * * * *